(12) United States Patent
Nakamura (10) Patent No.: US 12,377,470 B2
(45) Date of Patent: Aug. 5, 2025

(54) COATED CUTTING TOOL (71) Applicant: TUNGALOY CORPORATION, Fukushima (JP)

(72) Inventor: Takaaki Nakamura, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 400 days.

(21) Appl. No.: 17/836,728

(22) Filed: Jun. 9, 2022

(65) Prior Publication Data

US 2022/0402046 A1 Dec. 22, 2022

(30) Foreign Application Priority Data

Jun. 18, 2021 (JP) ................................. 2021-101939

(51) Int. Cl.
| | | |
|---|---|---|
| *B23B 27/14* | (2006.01) | |
| *C23C 14/06* | (2006.01) | |
| *C23C 14/30* | (2006.01) | |
| *C23C 14/32* | (2006.01) | |

(52) U.S. Cl.
CPC ........ *B23B 27/148* (2013.01); *C23C 14/0664* (2013.01); *C23C 14/30* (2013.01); *C23C 14/325* (2013.01); *B23B 2228/10* (2013.01)

(58) Field of Classification Search
None
See application file for complete search history.

(56) References Cited

U.S. PATENT DOCUMENTS

| | | | | |
|---|---|---|---|---|
| 6,309,738 | B1 * | 10/2001 | Sakurai | C23C 28/42 51/307 |
| 2017/0275765 | A1 * | 9/2017 | Stiens | C23C 16/34 |
| 2018/0281078 | A1 * | 10/2018 | Hirano | C04B 41/52 |
| 2019/0030614 | A1 | 1/2019 | Katagiri | |
| 2020/0080187 | A1 * | 3/2020 | Katagiri | C23C 14/0641 |

FOREIGN PATENT DOCUMENTS

| | | | |
|---|---|---|---|
| CA | 2 285 460 A1 | 8/1999 | |
| CN | 109304489 A | 2/2019 | |
| EP | 1133582 B1 * | 3/2004 | ............ C23C 16/34 |
| JP | H11-222665 A | 8/1999 | |
| JP | 2004124246 A * | 4/2004 | ........... C23C 14/081 |
| JP | 2015-160259 A | 9/2015 | |

OTHER PUBLICATIONS

Translation—EP-1133582-B1—Anderbouhr S, Mar. 24, 2004 (Year: 2004).*
Translation—JP-2004124246-A, Hiroshi T, Apr. 22, 2004 (Year: 2004).*

* cited by examiner

*Primary Examiner* — Seth Dumbris
(74) *Attorney, Agent, or Firm* — Studebaker Brackett PLLC (57) ABSTRACT

The coated cutting tool comprises a substrate and a coating layer formed on a surface of the substrate, the coating layer comprises an alternating laminate structure in which two or more first layers and two or more second layers are alternately laminated, the first layer is a compound layer containing $Ti(C_aN_{1-a})$, the second layer is a compound layer containing $(Ti_xAl_{1-x})(C_yN_{1-y})$, an average thickness per layer of each of the first layers and the second layers in the alternating laminate structure is 3 nm or more and 300 nm or less, and an average thickness of the alternating laminate structure is 1.0 μm or more and 8.0 μm or less.

19 Claims, 2 Drawing Sheets

COATED CUTTING TOOL

BACKGROUND OF THE INVENTION

Field of the Invention

The present invention relates to a coated cutting tool.

Description of Related Art

In the related art, cutting tools made of cemented carbide or cubic boron nitride (cBN) sintered body have been widely used for cutting steel or the like. Among them, surface coated cutting tools containing one or two or more hard coating films such as a TiN layer and a TiAlN layer on a surface of a cemented carbide substrate are used for various processing due to high versatility thereof.

For example, Patent Publication JP-A-2015-160259 proposes a surface-coated cutting tool having, on a surface of a tool substrate made of any of a WC cemented carbide, a TiCN-base cermet, and a cubic boron nitride sintered body, a hard coating layer formed by vapor deposition, wherein (a) the hard coating layer includes a first layer formed on the surface of the tool substrate and a second layer formed on the first layer, the first layer is a nitride layer of Ti and Al satisfying a composition formula: $(Ti_{1-a}Al_a)N$ (where a is an atomic ratio satisfying $0.3 \leq a \leq 0.7$) and having an average layer thickness of 0.5 to 3.0 μm, and the second layer is a carbonitride layer of Ti and Al satisfying a composition formula: $(Ti_{1-b}Al_b)(N_{1-c}C_c)$ (where b and c are atomic ratios satisfying $0.30 \leq b \leq 0.7$ and $0.01 \leq c \leq 0.4$) and having an average layer thickness of 0.5 to 2.0 μm, (b) crystal grains in the first layer and the second layer are made of a crystal growth structure continuous in an interface region having an interface length ratio of 70% or more to an interface between the first layer and the second layer, and the continuous crystal growth structure exhibits the same crystal orientation, and (c) an average width of the crystal grains in the second layer parallel to the surface of the tool substrate is 0.05 to 1.0 μm, an average height of the crystal grains in the second layer perpendicular to the surface of the tool substrate is 0.05 to 1.5 μm, and an average aspect ratio (height/width) of the crystal grains in the second layer is 1 to 10.

SUMMARY

Technical Problem

Lathe processing of difficult-to-cut materials such as stainless steel in recent years has tended to increase in speed and feed, and as cutting conditions tend to be stricter than that in the related art, it is required to improve wear resistance and fracture resistance and extend a tool life. In the surface-coated cutting tool proposed in Patent Publication JP-A-2015-160259, by increasing a Ti content of the coating layer, a crystal grain size is increased to be able to improve the wear resistance, while the fracture resistance is reduced, and consequently it is difficult to extend a tool life.

The present invention has been made in light of the above circumstances, and an object of the present invention is to provide a coated cutting tool having improved wear resistance and fracture resistance and a long tool life.

Solution to Problem

The present inventor has conducted research on extending a tool life of a coated cutting tool, and has found that when the coated cutting tool has a specific configuration, it is possible to improve wear resistance and fracture resistance thereof, and as a result, the tool life of the coated cutting tool can be extended. Thus, the invention has been completed.

That is, the gist of the present invention is as follows.

[1] A coated cutting tool comprising a substrate and a coating layer formed on a surface of the substrate, wherein the coating layer comprises an alternating laminate structure in which two or more first layers and two or more second layers are alternately laminated, the first layer is a compound layer containing a composition represented by a following formula (1):

$$Ti(C_aN_{1-a}) \quad (1)$$

[where a represents an atomic ratio of a C element to a total ratio of the C element and an N element and satisfies $0.1 \leq a \leq 0.4$], the second layer is a compound layer containing a composition represented by a following formula (2):

$$(Ti_xAl_{1-x})(C_yN_{1-y}) \quad (2)$$

[where x represents an atomic ratio of a Ti element to a total ratio of the Ti element and an Al element and satisfies $0.4 \leq x \leq 0.8$, and y represents an atomic ratio of a C element to a total ratio of the C element and an N element and satisfies $0.1 \leq y \leq 0.4$], an average thickness per layer of each of the first layers and the second layers in the alternating laminate structure is 3 nm or more and 300 nm or less, and an average thickness of the alternating laminate structure is 1.0 μm or more and 8.0 μm or less.

[2] The coated cutting tool according to [1], wherein an atomic ratio of the Ti element to a total ratio of all metal elements in the coating layer is 0.7 or more and 0.9 or less.

[3] The coated cutting tool according to [1] or [2], wherein an average grain size of crystal grains in the alternating laminate structure is 0.1 μm or more and 1.0 μm or less.

[4] The coated cutting tool according to any one of [1] to [3], wherein a structure form in the alternating laminate structure is a columnar crystal.

[5] The coated cutting tool according to any one of [1] to [4], wherein the coating layer comprises a lower layer between the substrate and the alternating laminate structure, the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the lower layer is 0.2 μm or more and 3.0 μm or less.

[6] The coated cutting tool according to any one of [1] to [5], wherein the coating layer comprises an upper layer on the surface opposite to the substrate in the alternating laminate structure, the upper layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the upper layer is 0.2 μm or more and 3.0 μm or less.

[7] The coated cutting tool according to any one of [1] to [6], wherein an average thickness of the entire coating layer is 1.0 μm or more and 10.0 μm or less.

Advantageous Effects of Invention

According to the present invention, it is possible to provide a coated cutting tool having improved wear resistance and fracture resistance and a long tool life.

DETAILED DESCRIPTION

Hereinafter, an embodiment for implementing the invention (hereinafter, simply referred to as "the present embodiment") will be described in detail, but the invention is not limited to the following embodiment. The invention can be modified in various ways without departing from the gist thereof. In the drawings, the same elements are designated by the same reference numerals, and repeated description will be omitted. Further, unless otherwise specified, a positional relationship such as up, down, left, and right is based on a positional relationship shown in the drawing. Furthermore, a dimensional ratio in the drawing is not limited to a ratio shown.

A coated cutting tool in the present embodiment comprises a substrate and a coating layer formed on a surface of the substrate. The coating layer comprises an alternating laminate structure in which two or more first layers and two or more second layers are alternately laminated, the first layer is a compound layer containing a composition represented by a following formula (1):

$$Ti(C_aN_{1-a}) \quad (1)$$

[where a represents an atomic ratio of a C element to a total ratio of the C element and an N element and satisfies $0.1 \leq a \leq 0.4$], the second layer is a compound layer containing a composition represented by a following formula (2):

$$(Ti_xAl_{1-x})(C_yN_{1-y}) \quad (2)$$

[where x represents an atomic ratio of a Ti element to a total ratio of the Ti element and an Al element and satisfies $0.4 \leq x \leq 0.8$, and y represents an atomic ratio of a C element to a total ratio of the C element and an N element and satisfies $0.1 \leq y \leq 0.4$], an average thickness per layer of each of the first layers and the second layers in the alternating laminate structure is 3 nm or more and 300 nm or less, and an average thickness of the alternating laminate structure is 1.0 μm or more and 8.0 μm or less.

Factors why such a coated cutting tool has improved wear resistance and fracture resistance and a long tool life are not clear in detail, but the present inventor considers the factors as follows. However, the factors are not limited thereto. Specifically, when a in $Ti(C_aN_{1-a})$ in the first layer forming the coating layer is 0.1 or more, hardness of the first layer improves to improve the wear resistance of the coated cutting tool. Additionally, when a in $Ti(C_aN_{1-a})$ in the first layer forming the coating layer is 0.4 or less, structure refinement in the first layer is inhibited to improve the wear resistance of the coated cutting tool and also improve the fracture resistance of the coated cutting tool. Meanwhile, when x in $(Ti_xAl_{1-x})(C_yN_{1-y})$ in the second layer forming the coating layer is 0.4 or more, as an effect achieved by containing Ti, the wear resistance of the coated cutting tool is improved, and excessive refinement of grains in the second layer is further inhibited. As a result, the structure becomes columnar to improve the wear resistance of the coated cutting tool. Additionally, when x in $(Ti_xAl_{1-x})(C_yN_{1-y})$ in the second layer forming the coating layer is 0.8 or less, coarsening of the grains in the second layer is inhibited to be able to inhibit chipping of the coated cutting tool due to dropping of the grains. Meanwhile, when y in $(Ti_xAl_{1-x})(C_yN_{1-y})$ in the second layer forming the coating layer is 0.1 or more, hardness of the second layer is improved to improve the wear resistance of the coated cutting tool. Additionally, when y in $(Ti_xAl_{1-x})(C_yN_{1-y})$ in the second layer forming the coating layer is 0.4 or less, structure refinement in the second layer is inhibited to improve the wear resistance of the coated cutting tool and also improve the fracture resistance of the coated cutting tool. Also, in the coated cutting tool in the present embodiment, when the coating layer comprises the alternating laminate structure in which the two or more first layers and the two or more second layers are alternately laminated, the crystal grains are more easily continuously grown in an intended composition of each of the layers than when the coating layer is formed of a single layer. In addition, in the coating layer in the coated cutting tool in the present embodiment, a composition of the first layer is $Ti(C_aN_{1-a})$ and a composition of the second layer is $(Ti_xAl_{1-x})(C_yN_{1-y})$, and the entire alternating laminate structure contains carbon (C). This improves hardness of the entire coating layer and improves the wear resistance of the coated cutting tool. Moreover, in the coated cutting tool in the present embodiment, the coating layer comprises the alternating laminate structure in which the two or more first layers and the two or more second layers are alternately laminated to thus inhibit coarsening of the grains in each of the layers and thereby improve the fracture resistance of the coated cutting tool. In addition, since an average thickness per layer of each of the first layers and the second layers in the alternating laminate structure is 3 nm or more, a laminated configuration of the coating layer improves toughness thereof and improves the wear resistance and fracture resistance of the coated cutting tool. Additionally, since an average thickness per layer of each of the first layers and the second layers in the alternating laminate structure is 300 nm or less, crystal nucleation in the second layer is inhibited and the crystal grains are excellently grown to be able to inhibit refinement of the grains, inhibit the specified crystal grains from growing to be coarse in the first layer, and thereby inhibit chipping beginning with the dropping of the grains. When the average thickness of the alternating laminate structure is 1.0 μm or more, the grains in each of the layers are appropriately coarsened to improve the wear resistance of the coated cutting tool and also improve the fracture resistance of the coated cutting tool. Additionally, when the average thickness of the alternating laminate structure is 8.0 μm or less, delamination of the coating layer is inhibited and, mainly due to that, the fracture resistance of the coated cutting tool is improved, and the wear resistance of the coated cutting tool is also improved. Combined with these effects, the coated cutting tool of the present embodiment has improved wear resistance and fracture resistance and a long tool life.

The coated cutting tool of the present embodiment includes a substrate and a coating layer formed on a surface of the substrate. The substrate used in the present embodiment is not particularly limited as long as the substrate can be used as a substrate for a coated cutting tool. Examples of the substrate include cemented carbide, cermet, ceramics, a cubic boron nitride sintered body, a diamond sintered body, and high speed steel. Among them, it is more preferable that the substrate is one or more selected from the group consisting of cemented carbide, cermet, ceramics, and a cubic boron nitride sintered body, because the fracture resistance of the coated cutting tool is more excellent.

In the coated cutting tool in the present embodiment, an average thickness of the entire coating layer is preferably 1.0 µm or more and 10.0 µm or less. In the coated cutting tool in the present embodiment, when the average thickness of the entire coating layer is 1.0 µm or more, the wear resistance tends to improve, and the fracture resistance of the coat cutting tool also tends to improve. Additionally, in the coated cutting tool in the present embodiment, when the average thickness of the entire coating layer is 10.0 µm or less, the delamination of the coating layer is inhibited and, mainly due to that, the fracture resistance tends to improve. From the same viewpoint, the average thickness of the entire coating layer is preferably 1.2 µm or more and 9.0 µm or less, and more preferably 1.4 µm or more and 8.0 µm or less.

[First Layer]

In the coated cutting tool in the present embodiment, the first layer is a compound layer containing the composition represented by the following formula (1):

$$Ti(C_a N_{1-a}) \quad (1)$$

[where a represents an atomic ratio of a C element to a total ratio of the C element and an N element and satisfies $0.1 \leq a \leq 0.4$].

When a in $Ti(C_a N_{1-a})$ in the first layer forming the coating layer is 0.1 or more, the hardness of the first layer is improved to improve the wear resistance of the coated cutting tool. Additionally, when a in $Ti(C_a N_{1-a})$ in the first layer forming the coating layer is 0.4 or less, the structure refinement in the first layer is inhibited to improve the wear resistance of the coated cutting tool and also improve the fracture resistance of the coated cutting tool. From the same viewpoint, a in $Ti(C_a N_{1-a})$ is preferably 0.2 or more and 0.4 or less.

In the present embodiment, when the composition of each compound layer is described as, e.g., $Ti(C_{0.20}N_{0.80})$, it means that the atomic ratio of the C element to the total amount of the C element and the N element is 0.20, and the atomic ratio of the N element to the total amount of the C element and the N element is 0.80. That is, it means that the amount of the C element is 20 atomic % with respect to the total amount of the C element and the N element, and the amount of the N element is 80 atomic % with respect to the total amount of the C element and the N element.

[Second Layer]

In the coated cutting tool in the present embodiment, the second layer is a compound layer containing the composition represented by the following formula (2):

$$(Ti_x Al_{1-x})(C_y N_{1-y}) \quad (2)$$

[where x represents an atomic ratio of a Ti element to a total ratio of the Ti element and an Al element and satisfies $0.4 \leq x \leq 0.8$, and y represents an atomic ratio of a C element to a total ratio of the C element and the N element and satisfies $0.1 \leq y \leq 0.4$].

When x in $(Ti_x Al_{1-x})(C_y N_{1-y})$ in the second layer forming the coating layer is 0.4 or more, as an effect achieved by containing Ti, the wear resistance of the coated cutting tool is improved, and the excessive refinement of the grains in the second layer is further inhibited. As a result, the structure becomes columnar to improve the wear resistance of the coated cutting tool. Additionally, when x in $(Ti_x Al_{1-x})(C_y N_{1-y})$ in the second layer forming the coating layer is 0.8 or less, the coarsening of the grains in the second layer is inhibited to be able to inhibit the chipping of the coated cutting tool due to the dropping of the grains. From the same viewpoint, x in $(Ti_x Al_{1-x})(C_y N_{1-y})$ is preferably 0.5 or more and 0.8 or less, and more preferably 0.5 or more and 0.7 or less. Meanwhile, when y in $(Ti_x Al_{1-x})(C_y N_{1-y})$ in the second layer forming the coating layer is 0.1 or more, the hardness of the second layer is improved to improve the wear resistance of the coated cutting tool. Additionally, when y in $(Ti_x Al_{1-x})(C_y N_{1-y})$ in the second layer forming the coating layer is 0.4 or less, the structure refinement in the second layer is inhibited to improve the wear resistance of the coated cutting tool and also improve the fracture resistance of the coated cutting tool. From the same viewpoint, y in $(Ti_x Al_{1-x})(C_y N_{1-y})$ is preferably 0.2 or more and 0.4 or less.

In the coated cutting tool of the present embodiment, when a lower layer described later is not formed, it is preferable that the second layer is first formed on the surface of the substrate. In the coated cutting tool of the present embodiment, when the second layer is first formed on the surface of the substrate, the adhesion between the substrate and the coating layer tends to be improved.

In addition, the atomic ratio of the Ti element to a total ratio of all metal elements in the coating layer is preferably 0.7 or more and 0.9 or less. When the atomic ratio of the Ti element to the total ratio of all the metal elements in the coating layer is 0.7 or more, the ratio of the Ti element in the coating layer increases, and consequently the grain sizes of the grains increase, and the wear resistance of the coated cutting tool tends to improve. Additionally, when the atomic ratio of the Ti element to the total ratio of all the metal elements in the coating layer is 0.9 or less, the coarsening of the grains is inhibited, and consequently the fracture resistance of the coated cutting tool tends to improve. From the same viewpoint, the atomic ratio of the Ti element to the total ratio of all the metal elements in the coating layer is preferably 0.7 or more and 0.8 or less.

[Alternately Laminated Structure]

In the coated cutting tool in the present embodiment, the coating layer comprises the alternating laminate structure in which the two or more first layers and the two or more second layers are alternately laminated. In the coated cutting tool in the present embodiment, when the coating layer comprises the alternating laminate structure in which the two or more first layers and the two or more second layers are alternately laminated, the crystal grains are more easily continuously grown in an intended composition of each of the layers than when the coating layer is formed of a single layer. In addition, in the coating layer in the coated cutting tool in the present embodiment, the composition of the first layer is $Ti(C_a N_{1-a})$ and the composition of the second layer is $(Ti_x Al_{1-x})(C_y N_{1-y})$, and the entire alternating laminate structure contains carbon (C). This improves the hardness of the entire coating layer and improves the wear resistance of the coated cutting tool. Moreover, in the coated cutting tool in the present embodiment, the coating layer comprises the alternating laminate structure in which the two or more first layers and the two or more second layers are alternately laminated to thus inhibit the coarsening of the grains in each of the layers and thereby improve the fracture resistance of the coated cutting tool.

Also, in the coated cutting tool in the present embodiment, an average thickness per layer of each of the first layers and the second layers is 3 nm or more and 300 nm or less. Since an average thickness per layer of each of the first layers and the second layers in the alternating laminate structure is 3 nm or more, the laminated configuration of the coating layer improves the toughness thereof and improves the wear resistance and fracture resistance of the coated cutting tool. Additionally, in the alternating laminate structure, since an average thickness per layer of each of the first layers and the second layers is 300 nm or less, the crystal nucleation in the second layer is inhibited, and the crystal grains are excellently grown to be able to inhibit the refinement of the grains, inhibit the specified crystal grains from growing to be coarse in the first layer, and thereby inhibit chipping beginning with the dropping of the grains. From the same viewpoint, the average thickness of per layer of each of the first layers and the second layers is preferably 5 nm or more and 250 nm or less, and more preferably 10 nm or more and 250 nm or less.

Note that the average thickness per layer of each of the first layers may be the same as or different from the average thickness per layer of each of the second layers.

In addition, in the coated cutting tool in the present embodiment, an average thickness of the alternating laminate structure is 1.0 μm or more and 8.0 μm or less. When the average thickness of the alternating laminate structure is 1.0 μm or more, the grains in each of the layers are coarsened to improve the wear resistance of the coated cutting tool and also improve the fracture resistance of the coated cutting tool. Additionally, when the average thickness of the alternating laminate structure is 8.0 μm or less, the delamination of the coating layer is inhibited and, mainly due to that, the fracture resistance of the coated cutting tool is improved, and the wear resistance of the coated cutting tool is also improved. From the same viewpoint, the average thickness of the alternating laminate structure is preferably 1.2 μm or more and 6.0 μm or less, and more preferably 1.4 μm or more and 4.2 μm or less.

In addition, in the coated cutting tool in the present embodiment, an average grain size of the crystal grains in the alternating laminate structure preferably is 0.1 μm or more and 1.0 μm or less. When the average grain size of the crystal grains in the alternating laminate structure is 0.1 μm or more, the grains are coarsened, and consequently the wear resistance of the coated cutting tool tends to improve. Meanwhile, when the average grain size of the crystal grains in the alternating laminate structure is 1.0 μm or less, it is possible to inhibit the chipping of the coated cutting tool due to the dropping of the grains. From the same viewpoint, the average grain size of the crystal grains in the alternating laminate structure is preferably 0.1 μm or more and 0.9 μm or less, and preferably 0.2 μm or more and 0.8 μm or less.

In the present embodiment, the average grain size of the crystal grains in the alternating laminate structure is a value obtained by drawing, in a photograph of a sample, a line in a direction parallel to the surface of the substrate and dividing a length of the line by the number of crystal grains existing on the line. Specifically, the average grain size of the crystal grains in the alternating laminate structure can be measured by a method described in Examples described later. Further, the crystal grains in the alternating laminate structure include either the crystal grains of the compound having the composition represented by the formula (1) or the crystal grains of the compound having the composition represented by the formula (2), or include both the crystal grains of the compound having the composition represented by the formula (1) and the crystal grains of the compound having the composition represented by the formula (2).

In the coated cutting tool in the present embodiment, the structure form in the alternating laminate structure is preferably the columnar crystal. When the structure form in the alternating laminate structure is the columnar crystal, it is possible to inhibit abrasive wear, and consequently the wear resistance of the coated cutting tool tends to improve.

In the present embodiment, it is assumed that, when an aspect ratio of the crystal grains in the alternating laminate structure is 1.2 or more, the structure form therein is the columnar crystal. An upper limit of the aspect ratio of the crystal grains in the alternating laminate structure is not particularly limited, but is, e.g., 4.0 or less when consideration is given to the thickness of an alternately laminated layer.

Also, in the present embodiment, the aspect ratio can be measured according to the method described later in the example below.

In the coated cutting tool in the present embodiment, the number of repetitions of the first layers and the second layers, i.e., the number of times the first layers and the second layers are alternately and repeatedly laminated is preferably 2 or more and 400 or less, more preferably 5 or more and 300 or less, and still more preferably 7 or more and 200 or less.

Note that, in the present embodiment, when the first layer and the second layer are each formed for one time, "the number of repetitions" is 1 time.

Figure 1:
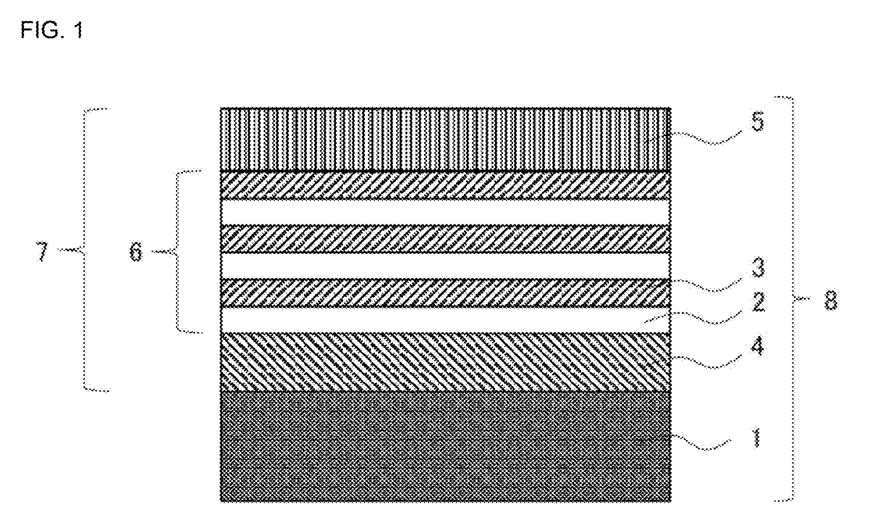
FIG. 1 is a schematic view showing an example of a coated cutting tool of the invention.

FIG. 1 is a schematic cross-sectional view showing an example of the coated cutting tool in the present embodiment. A coated cutting tool 8 comprises a substrate 1 and a coating layer 7 formed on a surface of the substrate 1. The coating layer 7 has, over the substrate 1, a lower layer 4, an alternating laminate structure 6, and an upper layer 5 which are laminated in this order. Also, in the alternating laminate structure 6, three second layers 2 and three first layers 3 are alternately and repeatedly formed in this order.

Figure 2:
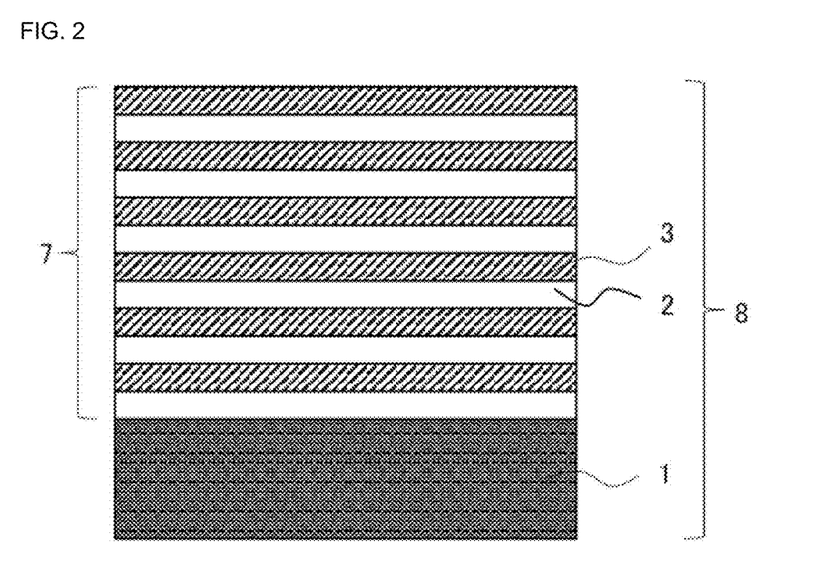
FIG. 2 is a schematic view showing an another example of a coated cutting tool of the invention.

FIG. 2 is a schematic cross-sectional view showing another example of the coated cutting tool in the present embodiment. The coated cutting tool 8 comprises the substrate 1 and the coating layer 7 formed on the surface of the substrate 1. The coating layer 7 has an alternating laminate structure in which, over the substrate 1, the six second layers 2 and the six first layer 3 are alternately and repeatedly formed in this order.

[Upper Layer]

The coating layer used in the present embodiment may include an upper layer on a surface opposite to the substrate in the alternating laminate structure. The upper layer is preferably a single layer or a laminate of a compound containing at least one element selected from the group consisting of Ti, Zr, Hf, V, Nb, Ta, Cr, Mo, W, Al, Si, and Y, and at least one element selected from the group consisting of C, N, O, and B (however, the compound having the composition represented by the formula (1) and the compound having the composition represented by the formula (2) are excluded). It is more preferable that the upper layer is a single layer or a laminate of such a compound because the upper layer is more excellent in the wear resistance.

From the same viewpoint as described above, the upper layer more preferably comprises a compound containing an element of at least one kind selected from the group consisting of Ti, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), still more preferably comprises a compound containing an element of at least one kind selected from the group consisting of Ti, Nb, Ta, Cr, W, Al, Si, and Y and N, and particularly preferably comprises a compound containing an element of at least one kind selected from the group consisting of Ti, Cr, Al, and Si and N. A specific compound contained in the upper layer is not particularly limited, and examples of the specific compound include TiAlN, AlCrN, and TiSiN. The upper layer may be a single layer or may also be a multilayer (laminated layer) including two or more layers.

In the coating layer used in the present embodiment, an average thickness of the upper layer is preferably 0.2 μm or more and 3.0 μm or less. When the average thickness of the upper layer is 0.2 μm or more, the wear resistance of the coated cutting tool tends to improve. Additionally, when the average thickness of the upper layer is 3.0 μm or less, the delamination of the coating layer is inhibited and, mainly due to that, the fracture resistance of the coated cutting tool tends to improve. From the same viewpoint, the average thickness of the upper layer is more preferably 0.3 μm or more and 2.0 μm or less, and still more preferably 0.5 μm or more and 1.5 μm or less.

[Lower Layer]

The coating layer used in the present embodiment preferably includes a lower layer between the substrate and the alternating laminate structure of the first layer and the second layer. Accordingly, the adhesion between the substrate and the coating layer tends to be further improved. Among them, from the same viewpoint as above, the lower layer preferably comprises a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), more preferably comprises a compound containing an element of at least one kind selected from the group consisting of Ti, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), still more preferably comprises a compound containing an element of at least one kind selected from the group consisting of Ti, Ta, Cr, W, Al, Si, and Y and N, and particularly preferably comprises a compound containing an element of at least one kind selected from the group consisting of Ti, Al, and Si and N. A specific compound contained in the lower layer is not particularly limited, and examples of the specific compound include TiN, TiAlN, and TiAlSiN. The lower layer may be a single layer or may also be a multilayer including two or more layers.

In the coating layer used in the present embodiment, an average thickness of the lower layer is preferably 0.2 μm or more and 3.0 μm or less. When the average thickness of the lower layer is 0.2 μm or more, the wear resistance of the coated cutting tool tends to improve. Additionally, when the average thickness of the lower layer is 3.0 μm or less, the delamination of the coating layer is inhibited and, mainly due to that, the fracture resistance of the coated cutting tool tends to improve. From the same viewpoint, the average thickness of the lower layer is more preferably 0.3 μm or more and 1.0 μm or less, and still more preferably 0.3 μm or more and 0.5 μm or less.

[Method for Manufacturing Coating Layer]

A method of manufacturing the coating layer in the coated cutting tool of the present embodiment is not particularly limited, and includes, for example, a physical vapor deposition method such as an ion plating method, an arc ion plating method, a sputtering method, and an ion mixing method. Use of the physical vapor deposition method for forming the coating layer is preferred because a sharp edge can be formed. Among them, the arc ion plating method is more preferred because the adhesion between the coating layer and the substrate is more excellent.

[Method for Manufacturing Coated Cutting Tool]

A method of manufacturing the coated cutting tool of the present embodiment will be described below with reference to specific examples. The method of manufacturing the coated cutting tool of the present embodiment is not particularly limited as long as a configuration of the coated cutting tool can be implemented.

First, a substrate processed into a tool shape is housed in a reaction vessel of a physical vapor deposition device, and a metal evaporation source is disposed in the reaction vessel. Then, the inside of the reaction vessel is evacuated until a pressure thereof is a vacuum of $1.0 \times 10^{-2}$ Pa or less, and the substrate is heated to a temperature of 200° C. to 700° C. by a heater in the reaction vessel. After heating, Ar gas is introduced into the reaction vessel to make the pressure in the reaction vessel to 0.5 Pa to 5.0 Pa. In an Ar gas atmosphere with a pressure of 0.5 Pa to 5.0 Pa, a bias voltage of −500 V to −350 V is applied to the substrate, a current of 40 A to 50 A is flowed through a tungsten filament in the reaction vessel, and the surface of the substrate is subjected to an ion bombardment treatment with Ar gas. After the surface of the substrate is subjected to the ion bombardment treatment, the inside of the reaction vessel is evacuated until the pressure is a vacuum of $1.0 \times 10^{-2}$ Pa or less When forming the lower layer used in the present embodiment, the substrate is heated until the temperature reaches 400° C. to 700° C. After heating, gas is introduced into the reaction vessel to make the pressure in the reaction vessel to 0.5 Pa to 5.0 Pa. The gas is, for example, $N_2$ gas when the lower layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the lower layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas:$C_2H_2$ gas=95:5 to 85:15. Next, it is preferable that a bias voltage of −80 V to −40 V is applied to the substrate, and the metal evaporation source corresponding to a metal component of each layer is evaporated by an arc discharge of an arc current of 100 A to 200 A to form the lower layer.

When first layers to be used in the present embodiment are to be formed, a temperature of the substrate is controlled so as to reach 300° C. to 800° C., a gas mixture of a $C_2H_2$ gas and an $N_2$ gas is introduced into the reaction vessel to adjust the pressure in the reaction vessel to 1.0 Pa to 10.0 Pa. A volume ratio of the gas mixture is not particularly limited and, e.g., $C_2H_2$ gas:$N_2$ gas=3:97 to 25:75 may also be satisfied. Then, a bias voltage of −200 V to −40 V may be applied appropriately to the substrate to evaporate a Ti evaporation source by arc discharge using an arc current of 80 A to 200 A and form the first layers.

When forming the second layer used in the present embodiment, the temperature of the substrate is controlled to 300° C. to 800° C. It is preferable that the temperature of the substrate is the same as the temperature of the substrate when the first layer is formed because the first layer and the second layer can be formed continuously. After controlling the temperature, a gas mixture of a $C_2H_2$ gas and an $N_2$ gas is introduced into the reaction vessel to adjust the pressure in the reaction vessel to 1.0 Pa to 10.0 Pa. A volume ratio of the gas mixture is not particularly limited and, e.g., $C_2H_2$ Gas:$N_2$ Gas=3:97 to 25:75 may also be satisfied. Next, it is preferable that a bias voltage of −200 V to −40 V is applied to the substrate, and a metal evaporation source corresponding to a metal component of the second layer is evaporated by an arc discharge of an arc current of 80 A to 200 A to form the second layer.

In order to form the alternating laminate structure in which the first layer and the second layer are alternately laminated for two or more layers, it is preferable that each layer is formed alternately by alternately evaporating the Ti evaporation source and the metal evaporation source by the arc discharge under the above conditions. By adjusting an arc discharge time of the Ti evaporation source and the metal evaporation source, the thickness of each layer forming the alternating laminate structure can be controlled.

When the first layers are to be formed, if a ratio of the $C_2H_2$ gas is increased, in the composition represented by Formula (1), a ratio of the N element decreases to allow a ratio (a) of the C element to be increased. Meanwhile, when the second layers are to be formed, if the ratio of the $C_2H_2$ gas is increased, in the composition represented by Formula (2), the ratio of the N element decreases to allow a ratio (y) of the C element to be increased.

To adjust an average grain size of crystal grains in the alternating laminate structure to be used in the present embodiment to a predetermined value, in the process of forming the alternating laminate structure described above, the thicknesses of each layer in the alternating laminate structure, the ratio of the Ti element in the alternating laminate structure, the ratio of the C element in the first layers and/or the second layers, the thicknesses of the second layers, and the negative bias voltages may be adjusted appropriately. More specifically, when the thicknesses of each layer in the alternating laminate structure are reduced, the average grain size of the crystal grains in the alternating laminate structure tends to decrease. When the ratio of the Ti element in the alternating laminate structure is reduced, the average grain size of the crystal grains in the alternating laminate structure tends to decrease. When the ratio of the C element in the first layers and/or the second layers is increased, the average grain size of the crystal grains in the alternating laminate structure tends to decrease. When the thicknesses of the second layers are increased, the average grain size of the crystal grains in the alternating laminate structure tends to decrease. When the negative bias voltage is set high (on a side distant from zero), the average grain size of the crystal grains in the alternating laminate structure tends to decrease.

To adjust, to a predetermined value, an atomic ratio of the Ti element to a total ratio of all the metal elements in the coating layer to be used in the present embodiment, in the process of forming the alternating laminate structure described above, the thicknesses of each layer in the alternating laminate structure and the ratio of the Ti element in the second layer may be adjusted appropriately. More specifically, when the thickness of each of the first layers in the alternating laminate structure is increased (a ratio of the first layers is increased), the atomic ratio of the Ti element to the total ratio of all the metal elements in the coating layer tends to increase. When the ratio of the Ti element in the second layer is increased, the atomic ratio of the Ti element to the total ratio of all the metal elements in the coating layer tends to increase.

To provide the columnar crystal as the structure form in the alternating laminate structure to be used in the present embodiment, i.e., to adjust the aspect ratio of the crystal grains in the alternating laminate structure to 1.2 or more, in the process of forming the alternating laminate structure described above, the average grain size of the crystal grains in the alternating laminate structure and an average thickness in the alternating laminate structure may be adjusted appropriately. More specifically, when the average grain size of the crystal grains in the alternating laminate structure is decreased, the aspect ratio of the crystal grains in the alternating laminate structure tends to increase. When the average thickness in the alternating laminate structure is increased, the aspect ratio of the crystal grains in the alternating laminate structure tends to increase.

When forming the upper layer used in the present embodiment, it is preferable that the upper layer is formed under the same manufacturing conditions as those of the lower layer described above. That is, first, the substrate is heated until the temperature thereof reaches 400° C. to 700° C. After heating, gas is introduced into the reaction vessel to make the pressure in the reaction vessel to 0.5 Pa to 5.0 Pa. The gas is, for example, $N_2$ gas when the upper layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the upper layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas:$C_2H_2$ gas=95:5 to 85:15. Next, it is preferable that a bias voltage of −80 V to −40 V is applied to the substrate, and the metal evaporation source corresponding to a metal component of each layer is evaporated by an arc discharge of an arc current of 100 A to 200 A to form the upper layer.

The thickness of each layer forming the coating layer in the coated cutting tool of the present embodiment is measured from a cross-sectional structure of the coated cutting tool using an optical microscope, a scanning electron microscope (SEM), a transmission electron microscope (TEM), or the like. The average thickness of each layer in the coated cutting tool of the present embodiment can be obtained by measuring the thickness of each layer from three or more cross sections in the vicinity of a position 50 µm from a cutting edge ridgeline portion of a surface facing the metal evaporation source toward a center portion of the surface and by calculating an average value (arithmetic mean value).

Further, the composition of each layer forming the coating layer in the coated cutting tool of the present embodiment can be measured from the cross-sectional structure of the coated cutting tool of the present embodiment by using an energy dispersive X-ray analyzer (EDS) or a wavelength dispersive X-ray analyzer (WDS).

It is considered that the coated cutting tool of the present embodiment has an effect that the tool life can be extended as compared with that in the related art because the coated cutting tool is excellent in at least wear resistance and fracture resistance (however, the factors that can extend the tool life are not limited to the above). Specific examples of types of the coated cutting tool of the present embodiment include an indexable cutting insert for milling or lathe processing, a drill, or an end mill.

EXAMPLES

Hereinafter, the invention will be described in more detail by way of Examples, but the present invention is not limited to these examples.

Example 1

As a substrate, an insert of CNMG120408-TSF (manufactured by Tungaloy Corporation) (a cemented carbide having a composition of 54.0% Ti(C,N)-22.5% WC-6.8% NbC-1.0% Mo$_2$C-0.7% ZrC-7.5% Co-7.5% Ni (mass %)) was prepared. A Ti evaporation source and a metal evaporation source were disposed in a reaction vessel of an arc ion plating device so as to have a composition of each layer shown in Table 1. The prepared substrate was fixed to a fixing bracket of a rotary table in the reaction vessel.

Then, the inside of the reaction vessel was evacuated until a pressure was a vacuum of $5.0 \times 10^{-3}$ Pa or less. After evacuation, the substrate was heated to a temperature of 450° C. by a heater in the reaction vessel. After heating, Ar gas was introduced into the reaction vessel to make the pressure to 2.7 Pa.

In an Ar gas atmosphere with a pressure of 2.7 Pa, a bias voltage of −400 V to was applied to the substrate, a current of 40 A was flowed through a tungsten filament in the reaction vessel, and a surface of the substrate was subjected to an ion bombardment treatment with Ar gas for 30 minutes. After the ion bombardment treatment was completed, the inside of the reaction vessel was evacuated until the pressure was a vacuum of $5.0 \times 10^{-3}$ Pa or less.

For each of Invention samples 1 to 21, after the evacuation, the temperature of the substrate was controlled so as to reach the temperature (the temperature at the start of film formation) shown in Table 2, a gas mixture obtained by mixing a C$_2$H$_2$ gas and an N$_2$ gas with each other at the volume ratio shown Table 2 was introduced into the reaction vessel, and a pressure in the reaction vessel was adjusted to the pressure shown in Table 2. Then, the bias voltage shown in Table 2 was applied to the substrate to alternately evaporate, by arc discharge using the arc current shown in Table 2, the Ti evaporation source for the first layers having the composition shown in Table 1 and the metal evaporation source for the second layers having the composition shown in Table 1 in an order such that the lowermost layer shown in Table 1 was formed first on the surface of the substrate, and thereby alternately form the first layers and the second layers to form the alternating laminate structure. At this time, control was performed to achieve the pressure in the reaction vessel shown in Table 2. The respective thicknesses of the first layers, the second layers, and the alternating laminate structure were controlled by adjusting respective arc discharge periods therefor so as to have the thicknesses shown in Table 1.

For each of Comparative samples 1 to 12, after the evaluation, the temperature of the substrate was controlled so as to reach the temperature (the temperature at the start of film formation) shown in Table 2, and a gas was introduced into the reaction vessel. For each of Comparative samples 1 and 3 to 12, a gas mixture obtained by mixing a C$_2$H$_2$ gas and an N$_2$ gas with each other at the volume ratio shown in Table 2 was introduced into the reaction vessel while, for Comparative sample 2, an N$_2$ gas was introduced into the reaction vessel. Then, the bias voltage shown in Table 2 was applied to the substrate to alternately evaporate, by arc discharge using the arc current shown in Table 2, the Ti evaporation source for the first layers having the composition shown in Table 1 and the metal evaporation source for the second layers having the composition shown in Table 1 in an order such that the lowermost layer shown in Table 1 was formed first on the surface of the substrate, and thereby alternately form the first layers and the second layers to form the alternating laminate structure. At this time, control was performed to achieve the pressure in the reaction vessel shown in Table 2. The respective thicknesses of the first layers, the second layers, and the alternating laminate structure were controlled by adjusting respective arc discharge periods therefor so as to have the thicknesses shown in Table 1.

After forming each layer and alternating laminate structure on the surface of the substrate until each layer and alternating laminate structure had a predetermined average thickness as shown in Table 1, the heater was turned off, and after a temperature of a sample was 100° C. or lower, the sample was taken out from the reaction vessel.

TABLE 1

| | | Coating layer Alternating laminate structure | | | | | | |
|---|---|---|---|---|---|---|---|---|
| | | First layer: Ti(C$_a$N$_{1-a}$) | | Second layer: (Ti$_x$Al$_{1-x}$)(C$_y$N$_{1-y}$) | | | | |
| | Lowermost layer | Atomic ratio a of C element | Average thickness (nm) | Atomic ratio x of Ti element | Atomic ratio y of C element | Average thickness (nm) | Number of repetitions (times) | Average thickness of entire structure (μm) |
| Invention sample 1 | Second layer | 0.2 | 100 | 0.6 | 0.2 | 100 | 20 | 4.00 |
| Invention sample 2 | Second layer | 0.2 | 100 | 0.8 | 0.2 | 100 | 20 | 4.00 |
| Invention sample 3 | Second layer | 0.2 | 100 | 0.4 | 0.2 | 100 | 20 | 4.00 |
| Invention sample 4 | Second layer | 0.4 | 100 | 0.6 | 0.2 | 100 | 20 | 4.00 |
| Invention sample 5 | Second layer | 0.1 | 100 | 0.6 | 0.2 | 100 | 20 | 4.00 |
| Invention sample 6 | Second layer | 0.2 | 100 | 0.6 | 0.4 | 100 | 20 | 4.00 |
| Invention sample 7 | Second layer | 0.2 | 100 | 0.6 | 0.1 | 100 | 20 | 4.00 |
| Invention sample 8 | Second layer | 0.2 | 5 | 0.6 | 0.2 | 100 | 40 | 4.20 |
| Invention sample 9 | Second layer | 0.2 | 300 | 0.6 | 0.2 | 100 | 10 | 4.00 |
| Invention sample 10 | Second layer | 0.2 | 100 | 0.6 | 0.2 | 5 | 40 | 4.20 |

TABLE 1-continued

| | | First layer: Ti(C$_a$N$_{1-a}$) | | Second layer: (Ti$_x$Al$_{1-x}$)(C$_y$N$_{1-y}$) | | | | |
|---|---|---|---|---|---|---|---|---|
| | Lowermost layer | Atomic ratio a of C element | Average thickness (nm) | Atomic ratio x of Ti element | Atomic ratio y of C element | Average thickness (nm) | Number of repetitions (times) | Average thickness of entire structure (μm) |
| Invention sample 11 | Second layer | 0.2 | 100 | 0.6 | 0.2 | 300 | 10 | 4.00 |
| Invention sample 12 | Second layer | 0.2 | 250 | 0.6 | 0.2 | 250 | 8 | 4.00 |
| Invention sample 13 | Second layer | 0.2 | 10 | 0.6 | 0.2 | 10 | 200 | 4.00 |
| Invention sample 14 | Second layer | 0.2 | 100 | 0.6 | 0.2 | 100 | 7 | 1.40 |
| Invention sample 15 | Second layer | 0.2 | 100 | 0.6 | 0.2 | 100 | 40 | 8.00 |
| Invention sample 16 | Second layer | 0.3 | 20 | 0.6 | 0.3 | 20 | 70 | 2.80 |
| Invention sample 17 | Second layer | 0.3 | 20 | 0.5 | 0.3 | 20 | 70 | 2.80 |
| Invention sample 18 | Second layer | 0.3 | 20 | 0.6 | 0.3 | 20 | 70 | 2.80 |
| Invention sample 19 | Second layer | 0.3 | 20 | 0.5 | 0.3 | 20 | 70 | 2.80 |
| Invention sample 20 | Second layer | 0.2 | 100 | 0.6 | 0.2 | 100 | 20 | 4.00 |
| Comparative sample 1 | Second layer | 0.0 | 100 | 0.6 | 0.2 | 100 | 20 | 4.00 |
| Comparative sample 2 | Second layer | 0.2 | 100 | 0.6 | 0.0 | 100 | 20 | 4.00 |
| Comparative sample 3 | Second layer | 0.2 | 100 | 0.9 | 0.2 | 100 | 20 | 4.00 |
| Comparative sample 4 | Second layer | 0.2 | 100 | 0.3 | 0.2 | 100 | 20 | 4.00 |
| Comparative sample 5 | Second layer | 0.5 | 100 | 0.6 | 0.2 | 100 | 20 | 4.00 |
| Comparative sample 6 | Second layer | 0.2 | 100 | 0.6 | 0.5 | 100 | 20 | 4.00 |
| Comparative sample 7 | Second layer | 0.2 | 1 | 0.6 | 0.2 | 100 | 40 | 4.04 |
| Comparative sample 8 | Second layer | 0.2 | 400 | 0.6 | 0.2 | 100 | 8 | 4.00 |
| Comparative sample 9 | Second layer | 0.2 | 100 | 0.6 | 0.2 | 1 | 40 | 4.04 |
| Comparative sample 10 | Second layer | 0.2 | 100 | 0.6 | 0.2 | 400 | 8 | 4.00 |
| Comparative sample 11 | Second layer | 0.2 | 100 | 0.6 | 0.2 | 100 | 3 | 0.60 |
| Comparative sample 12 | Second layer | 0.2 | 100 | 0.6 | 0.2 | 100 | 50 | 10.00 |

TABLE 2

| | First layer | | | | | Second layer | | | | |
|---|---|---|---|---|---|---|---|---|---|---|
| | Temperature (° C.) | Pressure (Pa) | Voltage (V) | Current (A) | Volume ratio C$_2$H$_2$:N$_2$ | Temperature (° C.) | Pressure (Pa) | Voltage (V) | Current (A) | Volume ratio C$_2$H$_2$:N$_2$ |
| Invention sample 1 | 500 | 3.0 | −80 | 120 | 10:90 | 500 | 3.0 | −80 | 120 | 10:90 |
| Invention sample 2 | 500 | 3.0 | −100 | 120 | 10:90 | 500 | 3.0 | −100 | 120 | 10:90 |
| Invention sample 3 | 500 | 3.0 | −60 | 120 | 10:90 | 500 | 3.0 | −60 | 120 | 10:90 |
| Invention sample 4 | 500 | 2.0 | −40 | 120 | 25:75 | 500 | 2.0 | −80 | 120 | 10:90 |
| Invention sample 5 | 500 | 2.0 | −100 | 120 | 3:97 | 500 | 2.0 | −80 | 120 | 10:90 |
| Invention sample 6 | 500 | 5.0 | −80 | 120 | 10:90 | 500 | 5.0 | −40 | 120 | 25:75 |
| Invention sample 7 | 500 | 5.0 | −80 | 120 | 10:90 | 500 | 5.0 | −100 | 120 | 3:97 |
| Invention sample 8 | 500 | 3.0 | −60 | 80 | 10:90 | 500 | 3.0 | −80 | 80 | 10:90 |
| Invention sample 9 | 500 | 3.0 | −100 | 80 | 10:90 | 500 | 3.0 | −80 | 80 | 10:90 |
| Invention sample 10 | 500 | 3.0 | −80 | 200 | 10:90 | 500 | 3.0 | −80 | 200 | 10:90 |
| Invention sample 11 | 500 | 3.0 | −80 | 200 | 10:90 | 500 | 3.0 | −100 | 200 | 10:90 |
| Invention sample 12 | 500 | 3.0 | −100 | 120 | 10:90 | 500 | 3.0 | −100 | 120 | 10:90 |
| Invention sample 13 | 500 | 3.0 | −40 | 120 | 10:90 | 500 | 3.0 | −40 | 120 | 10:90 |
| Invention sample 14 | 500 | 3.0 | −80 | 120 | 10:90 | 500 | 3.0 | −80 | 120 | 10:90 |
| Invention sample 15 | 500 | 3.0 | −80 | 120 | 10:90 | 500 | 3.0 | −80 | 120 | 10:90 |
| Invention sample 16 | 400 | 3.0 | −60 | 120 | 18:72 | 400 | 3.0 | −60 | 120 | 18:72 |
| Invention sample 17 | 400 | 3.0 | −60 | 120 | 18:72 | 400 | 3.0 | −50 | 120 | 18:72 |
| Invention sample 18 | 700 | 3.0 | −80 | 120 | 18:72 | 700 | 3.0 | −80 | 120 | 18:72 |
| Invention sample 19 | 700 | 3.0 | −80 | 120 | 18:72 | 700 | 3.0 | −70 | 120 | 18:72 |
| Invention sample 20 | 500 | 3.0 | −120 | 120 | 10:90 | 500 | 3.0 | −120 | 120 | 10:90 |
| Comparative sample 1 | 500 | 3.0 | −80 | 120 | 0:100 | 500 | 3.0 | −80 | 120 | 10:90 |
| Comparative sample 2 | 500 | 3.0 | −80 | 120 | 10:90 | 500 | 3.0 | −80 | 120 | 0:100 |
| Comparative sample 3 | 500 | 3.0 | −120 | 120 | 10:90 | 500 | 3.0 | −120 | 120 | 10:90 |
| Comparative sample 4 | 500 | 3.0 | −50 | 120 | 10:90 | 500 | 3.0 | −50 | 120 | 10:90 |
| Comparative sample 5 | 500 | 2.0 | −40 | 120 | 30:70 | 500 | 2.0 | −60 | 120 | 10:90 |
| Comparative sample 6 | 500 | 5.0 | −60 | 120 | 10:90 | 500 | 5.0 | −40 | 120 | 30:70 |
| Comparative sample 7 | 500 | 3.0 | −40 | 80 | 10:90 | 500 | 3.0 | −80 | 80 | 10:90 |
| Comparative sample 8 | 500 | 3.0 | −100 | 200 | 10:90 | 500 | 3.0 | −80 | 200 | 10:90 |
| Comparative sample 9 | 500 | 3.0 | −80 | 120 | 10:90 | 500 | 3.0 | −40 | 120 | 10:90 |
| Comparative sample 10 | 500 | 3.0 | −80 | 120 | 10:90 | 500 | 3.0 | −100 | 120 | 10:90 |
| Comparative sample 11 | 400 | 3.0 | −80 | 120 | 10:90 | 400 | 3.0 | −80 | 120 | 10:90 |
| Comparative sample 12 | 700 | 3.0 | −80 | 120 | 10:90 | 700 | 3.0 | −80 | 120 | 10:90 |

(Average Thickness)

An average thickness of each layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The results are also shown in Table 1.

(Composition of Each Layer)

The composition of each layer of the obtained sample was measured by using an EDS attached to the TEM in a cross section in the vicinity of the position 50 μm from the cutting edge ridgeline portion of the surface of the coated cutting tool facing the metal evaporation source toward the center portion. Measurement results are shown in Table 1. Composition ratios of metal elements in each of the layers in Table 1 indicate atomic ratios of the metal elements to the entire metal element in a metal compound forming each layer. In addition, from a result of measurement of the composition of each of the layers, an atomic ratio of a Ti element to a total ratio of all the metal elements in the coating layer was calculated, the result of which is shown in Table 3.

(Average Grain Size, Structure Form, and Aspect Ratio)

For each of the obtained samples, using a commercially available transmission electron microscope (TEM), an average grain size of crystal grains in the alternating laminate structure was measured as follows. First, using a focused ion beam (FIB) processing machine, a thin film sample with a cross section in the alternating laminate structure of the coating layer (a cross section in a direction same as a direction of observing the thickness of the coating layer: perpendicular to the surface of the substrate) as an observation surface was prepared. A photograph of a scanning transmission electron microscope image (STEM image) was taken of the observation surface of the prepared sample. A straight line was drawn in a direction parallel to the surface of the substrate at the position corresponding to 80% of the thickness of the alternating laminate structure in a direction from the substrate side toward the surface side on the taken photograph, and the number of crystal grains existing on the line was measured. A length of the straight line was divided by the number of crystal grains existing on the line, and the obtained value was taken as the average grain size of the crystal grains at the alternating laminate structure. At this time, the length of the straight line was set to 10 μm or more.

Figure 3:
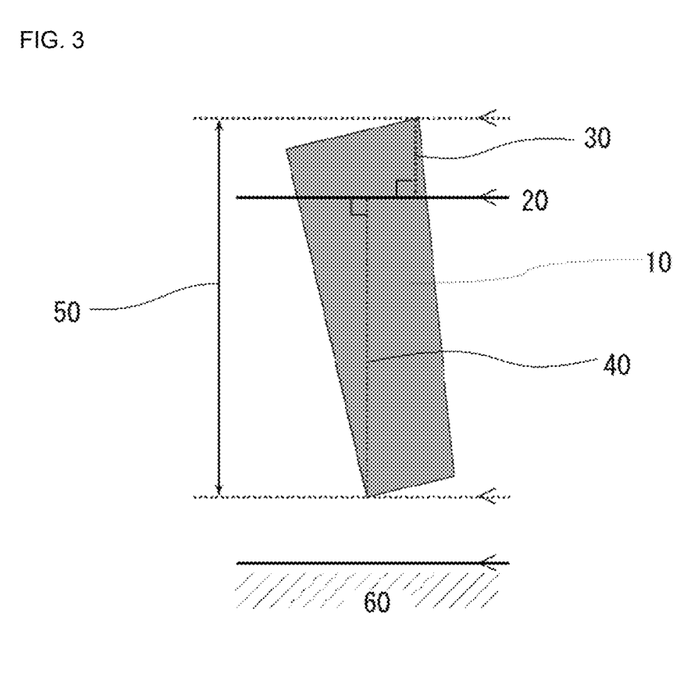
FIG. 3 is a supplementary view for illustrating how to determine an aspect ratio of grains in an alternating laminate structure.

Meanwhile, the aspect ratio of the grains in the alternating laminate structure was determined as follows. First, as illustrated in FIG. 3, in a crystal grain 10 among the crystal grains used to measure the average grain size, a sum of a maximum distance 30 in a perpendicular direction from a straight line 20 toward the surface side and a maximum distance 40 in the perpendicular direction from the straight line 20 toward the substrate side was assumed to a length 50 of a long axis. The length of the respective long axes of each crystal grain used to measure the average grain size was similarly determined, and a value obtained by dividing an average value of the lengths of these long axes by the average grain size was assumed to be the aspect ratio of the grains in the alternating laminate structure.

In addition, from a photograph taken of the observation surface, a structure form in the alternating laminate structure was specified. These measurement results are shown in Table 3.

TABLE 3

| | Coating layer | | | |
| --- | --- | --- | --- | --- |
| | Atomic ratio of Ti | Alternating laminate structure | | |
| | element to total ratio of all metal elements | Average grain size (μm) | Structure form | Aspect ratio |
| Invention sample 1 | 0.80 | 0.4 | Columnar crystal | 2.2 |
| Invention sample 2 | 0.90 | 0.6 | Columnar crystal | 1.8 |
| Invention sample 3 | 0.70 | 0.3 | Columnar crystal | 2.3 |
| Invention sample 4 | 0.80 | 0.4 | Columnar crystal | 2.0 |
| Invention sample 5 | 0.80 | 0.4 | Columnar crystal | 2.0 |
| Invention sample 6 | 0.80 | 0.4 | Columnar crystal | 2.0 |
| Invention sample 7 | 0.80 | 0.4 | Columnar crystal | 2.0 |
| Invention sample 8 | 0.62 | 0.2 | Columnar crystal | 2.7 |
| Invention sample 9 | 0.90 | 0.9 | Columnar crystal | 1.8 |
| Invention sample 10 | 0.98 | 0.8 | Columnar crystal | 1.7 |
| Invention sample 11 | 0.70 | 0.5 | Columnar crystal | 2.3 |
| Invention sample 12 | 0.80 | 0.9 | Columnar crystal | 2.0 |
| Invention sample 13 | 0.80 | 0.3 | Columnar crystal | 2.0 |
| Invention sample 14 | 0.80 | 0.1 | Columnar crystal | 1.2 |
| Invention sample 15 | 0.80 | 0.4 | Columnar crystal | 4.0 |
| Invention sample 16 | 0.80 | 0.4 | Columnar crystal | 1.5 |
| Invention sample 17 | 0.75 | 0.4 | Columnar crystal | 1.8 |
| Invention sample 18 | 0.80 | 0.2 | Columnar crystal | 2.0 |
| Invention sample 19 | 0.75 | 0.2 | Columnar crystal | 1.5 |
| Invention sample 20 | 0.80 | 0.1 | Columnar crystal | 2.0 |
| Comparative sample 1 | 0.80 | 1.2 | Columnar crystal | 1.5 |
| Comparative sample 2 | 0.80 | 1.1 | Columnar crystal | 1.5 |
| Comparative sample 3 | 0.95 | 0.9 | Columnar crystal | 1.3 |
| Comparative sample 4 | 0.65 | 0.1 | Columnar crystal | 1.0 |
| Comparative sample 5 | 0.80 | 0.4 | Columnar crystal | 1.2 |
| Comparative sample 6 | 0.80 | 0.4 | Columnar crystal | 1.5 |
| Comparative sample 7 | 0.60 | 0.2 | Columnar crystal | 2.4 |
| Comparative sample 8 | 0.92 | 1.2 | Columnar crystal | 1.3 |
| Comparative sample 9 | 0.99 | 0.7 | Columnar crystal | 1.2 |
| Comparative sample 10 | 0.68 | 1.1 | Columnar crystal | 1.8 |
| Comparative sample 11 | 0.80 | 0.4 | Columnar crystal | 1.0 |
| Comparative sample 12 | 0.80 | 0.4 | Columnar crystal | 4.6 |

By using the obtained sample, Cutting Tests 1 and 2 shown below were performed, and evaluations were made.

(Cutting Test 1 (Wear Resistance Test))
Work material: S45C
Work material shape: Round bar of S45C
Cutting speed: 250 m/min
Feed: 1.0 mm/rev
Depth of cut: 0.2 mm
Coolant: use
Evaluation items: the tool life was defined as when a flank wear width of a sample reached 0.2 mm or a sample was fractured (a cutting edge portion of the sample was chipped), and a processing time to the tool life was measured. It was evaluated that, as the processing time to the tool life was longer, the wear resistance was more excellent.

(Cutting Test 2 (Fracture Resistance Test))
Work material: S45C
Work material shape: Round bar having a groove formed in a side surface of S45C
Cutting speed: 150 m/min
Feed: 1.0 mm/rev
Depth of cut: 0.1 mm
Coolant: use
Evaluation items: the tool life was defined as when a sample was fractured, and the number of shocks to the tool life was measured. Note that the number of shocks was assumed to be the number of times the sample came into contact with the work material, and the test was ended at the time when the sample was fractured. It was evaluated that, as the number of shocks to the tool life was larger, the fracture resistance was more excellent.

As to the processing time until the tool life was reached in Cutting Test 1 (wear resistance test), evaluations were made with grade "A" for 40 minutes or more, with grade "B" for 30 minutes or more and less than 40 minutes, and with grade "C" for less than 30 minutes. In addition, as to the number of shocks until the tool life was reached in Cutting Test 2 (fracture resistance test), evaluations were made with grade "A" for 3000 or more, with grade "B" for 2000 or more and less than 3000, and with grade "C" for less than 2000. In the evaluations, "A" means best, "B" means second best, "C" means worst, and the larger numbers of "A"s and "B"s mean more excellent cutting performance. The obtained evaluation results are shown in Table 4.

TABLE 4

| | Cutting test 1 (Wear resistance) | | Cutting test 2 (Fracture resistance) | |
|---|---|---|---|---|
| | Tool life (minutes) | Evaluation | Tool life (number of shocks) | Evaluation |
| Invention sample 1 | 41 | A | 3000 | A |
| Invention sample 2 | 47 | A | 2600 | B |
| Invention sample 3 | 35 | B | 3500 | A |
| Invention sample 4 | 43 | A | 2700 | B |
| Invention sample 5 | 37 | B | 3200 | A |
| Invention sample 6 | 43 | A | 2800 | B |
| Invention sample 7 | 38 | B | 3300 | A |
| Invention sample 8 | 34 | B | 2900 | B |
| Invention sample 9 | 46 | A | 2300 | B |
| Invention sample 10 | 45 | A | 2100 | B |
| Invention sample 11 | 39 | B | 2400 | B |
| Invention sample 12 | 42 | A | 2700 | B |
| Invention sample 13 | 40 | A | 2900 | B |
| Invention sample 14 | 33 | B | 2300 | B |
| Invention sample 15 | 47 | A | 2100 | B |
| Invention sample 16 | 40 | A | 2800 | B |
| Invention sample 17 | 38 | B | 2900 | B |
| Invention sample 18 | 37 | B | 3000 | A |
| Invention sample 19 | 35 | B | 3200 | A |
| Invention sample 20 | 38 | B | 3400 | A |
| Comparative sample 1 | 24 | C | 2600 | B |
| Comparative sample 2 | 25 | C | 2800 | B |
| Comparative sample 3 | 34 | B | 100 | C |
| Comparative sample 4 | 26 | C | 2800 | B |
| Comparative sample 5 | 27 | C | 200 | C |
| Comparative sample 6 | 28 | C | 100 | C |
| Comparative sample 7 | 25 | C | 500 | C |
| Comparative sample 8 | 44 | A | 1200 | C |
| Comparative sample 9 | 26 | C | 300 | C |
| Comparative sample 10 | 41 | A | 1500 | C |
| Comparative sample 11 | 21 | C | 500 | C |
| Comparative sample 12 | 23 | C | 100 | C |

According to the results shown in Table 4, in each of Cutting Test 1 (wear resistance test) and Cutting Test 2 (fracture resistance test), each of the invention samples was evaluated with grade "B" or more. Meanwhile, in each or either of Cutting Test 1 (wear resistance test) and Cutting Test 2 (fracture resistance test), each of the comparative samples was evaluated with grade "C". Therefore, it can be understood that the wear resistance and fracture resistance of each of the invention samples were generally more excellent than those of each of the comparative samples.

From the above results, it was found that the tool life of invention samples were extended by improving the wear resistance and the fracture resistance.

Example 2

As a substrate, an insert of CNMG120408-TSF (manufactured by Tungaloy Corporation) (a cemented carbide having a composition of 54.0% Ti(C,N)-22.5% WC-6.8% NbC-1.0% Mo2C-0.7% ZrC-7.5% Co-7.5% Ni (mass %)) was prepared. A Ti evaporation source and a metal evaporation source were disposed in a reaction vessel of an arc ion plating device so as to have a composition of each layer in Table 5. The prepared substrate was fixed to a fixing bracket of a rotary table in the reaction vessel.

Then, the inside of the reaction vessel was evacuated until a pressure was a vacuum of $5.0 \times 10^{-3}$ Pa or less. After evacuation, the substrate was heated to a temperature of 450° C. by a heater in the reaction vessel. After heating, Ar gas was introduced into the reaction vessel to make the pressure to 2.7 Pa.

In an Ar gas atmosphere with a pressure of 2.7 Pa, a bias voltage of −400 V to was applied to the substrate, a current of 40 A was flowed through a tungsten filament in the reaction vessel, and a surface of the substrate was subjected to an ion bombardment treatment with Ar gas for 30 minutes. After the ion bombardment treatment was completed, the inside of the reaction vessel was evacuated until the pressure was a vacuum of $5.0 \times 10^{-3}$ Pa or less.

For each of Invention samples 21 to 25, after the evacuation, the substrate was heated until the temperature thereof reached the temperature (the temperature at the start of film formation) shown in Table 6, and an $N_2$ gas was introduced into the reaction vessel, and a pressure in the reaction vessel was adjusted to the pressure shown in Table 6. Then, the bias voltage shown in Table 6 was applied to the substrate to evaporate, by arc discharge using the arc current shown in Table 6, the metal evaporation source for the composition shown in Table 5 and thereby form the lower layer.

Then, by using the same conditions as used to manufacture the alternating laminate structure of Invention sample 1 for Invention sample 21, using the same conditions as used to manufacture the alternating laminate structure of Invention sample 16 for Invention sample 22, using the same conditions as used to manufacture the alternating laminate structure of Invention sample 17 for Invention sample 23, using the same conditions as used to manufacture the alternating laminate structure of Invention sample 18 for Invention sample 24, and using the same conditions as used to manufacture the alternating laminate structure of Invention sample 19 for Invention sample 25, the first layers and the second layers were alternately formed on the surfaces of the lower layers to form the alternating laminate structures.

Then, for each of Inventive samples 21 to 23, after the evacuation, the substrate was heated until the temperature thereof reached the temperature (the temperature at the start of film formation) shown in Table 7, and an $N_2$ gas was introduced into the reaction vessel, and a pressure in the reaction vessel was adjusted to the pressure shown in Table 7. Then, the bias voltage shown in Table 7 was applied to the substrate to evaporate, by arc discharge using the arc current shown in Table 7, the metal evaporation source for the composition shown in Table 5 and thereby form the upper layer.

After forming each layer and laminated structure on the surface of the substrate until each layer and laminated structure had a predetermined average thickness as shown in Table 5, the heater was turned off, and after a temperature of a sample was 100° C. or lower, the sample was taken out from the reaction vessel.

TABLE 6

| | Lower layer | | | |
|---|---|---|---|---|
| | Temperature (° C.) | Pressure (Pa) | Voltage (V) | Current (A) |
| Invention sample 21 | 500 | 3.0 | −80 | 120 |
| Invention sample 22 | 400 | 3.0 | −60 | 120 |
| Invention sample 23 | 400 | 3.0 | −60 | 120 |
| Invention sample 24 | 700 | 3.0 | −80 | 120 |
| Invention sample 25 | 700 | 3.0 | −80 | 120 |

TABLE 7

| | Upper layer | | | |
|---|---|---|---|---|
| | Temperature (° C.) | Pressure (Pa) | Voltage (V) | Current (A) |
| Invention sample 21 | 500 | 3.0 | −80 | 120 |
| Invention sample 22 | 400 | 3.0 | −60 | 120 |
| Invention sample 23 | 400 | 3.0 | −50 | 120 |

(Average Thickness)

An average thickness of each layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The results are also shown in Table 5.

(Composition of Each Layer)

The composition of each layer of the obtained sample was measured by using an EDS attached to the TEM in a cross section in the vicinity of the position 50 μm from the cutting edge ridgeline portion of the surface of the coated cutting tool facing the metal evaporation source toward the center portion. Measurement results are shown in Table 5. Composition ratios of metal elements in each of the layers in

TABLE 5

| | Coating layer | | | | | | | | | | |
|---|---|---|---|---|---|---|---|---|---|---|---|
| | Lower layer | | Alternating laminate structure | | | | | | | Upper layer | Thickness |
| | | | First layer: $Ti(C_aN_{1-a})$ | | Second layer: $(Ti_xAl_{1-x})(C_yN_{1-y})$ | | | | Average thickness | | |
| | Composition | Average thickness (μm) | Atomic ratio a of C element | Average thickness (nm) | Atomic ratio x of Ti element | Atomic ratio y of C element | Average thickness (nm) | Number of repetitions (times) | of entire structure (μm) | Composition | Average thickness (μm) | of entire coating layer (μm) |
| Invention sample 21 | Ti N | 0.3 | 0.2 | 100 | 0.6 | 0.2 | 100 | 20 | 4.00 | $Ti_{0.7}Al_{0.3}N$ | 1.50 | 5.80 |
| Invention sample 22 | $Ti_{0.5}Al_{0.5}N$ | 0.3 | 0.3 | 20 | 0.6 | 0.3 | 20 | 70 | 2.80 | $Al_{0.8}Cr_{0.2}N$ | 0.50 | 3.60 |
| Invention sample 23 | Ti N | 0.5 | 0.3 | 20 | 0.5 | 0.3 | 20 | 70 | 2.80 | $Ti_{0.9}Si_{0.1}N$ | 1.00 | 4.30 |
| Invention sample 24 | $Ti_{0.4}Al_{0.5}Si_{0.1}N$ | 0.5 | 0.3 | 20 | 0.6 | 0.3 | 20 | 70 | 2.80 | — | | 3.30 |
| Invention sample 25 | $Ti_{0.4}Al_{0.6}N$ | 0.3 | 0.3 | 20 | 0.5 | 0.3 | 20 | 70 | 2.80 | — | | 3.10 |

*"—" indicates formation of no layer

Table 5 indicate atomic ratios of the metal elements to the entire metal element in a metal compound forming each layer. In addition, from a result of measurement of the composition of each of the layers, an atomic ratio of a Ti element to a total ratio of all the metal elements in the coating layer was calculated, the result of which is shown in Table 8.

(Average Grain Size, Structure Form, and Aspect Ratio)

For each of the obtained samples, by using a commercially available transmission electron microscope (TEM), an average grain diameter of crystal grains in the alternating laminate structure was measured as follows. First, by using a focused ion beam (FIB) processing machine, a thin film sample with a cross section in the alternating laminate structure of the coating layer (a cross section in a direction same as a direction of observing the thickness of the coating layer: perpendicular to the surface of the substrate) as an observation surface was prepared. A photograph of a scanning transmission electron image (STEM image) was taken on the observation surface of the prepared sample. A straight line was drawn in a direction parallel to the surface of the substrate at the position corresponding to 80% of the thickness of the alternating laminate structure in a direction from the substrate side toward the surface side on the taken photograph, and the number of crystal grains existing on the line was measured. A length of the straight line was divided by the number of crystal grains existing on the line, and the obtained value was taken as the average grain size of the crystal grains at the alternating laminate structure. At this time, the length of the straight line was set to 10 μm or more.

Meanwhile, the aspect ratio of the grains in the alternating laminate structure was determined as follows. First, as illustrated in FIG. 3, in a crystal grain 10 among the crystal grains used to measure the average grain size, the sum of the maximum distance 30 in the perpendicular direction from the straight line 20 toward the surface side and the maximum distance 40 in the perpendicular direction from the straight line 20 toward the substrate side was assumed to the length 50 of the long axis. The length of the respective long axes of each crystal grain used to measure the average grain size was similarly determined, and the value obtained by dividing the average value of the lengths of these long axes by the average grain size was assumed to be the aspect ratio of the grains in the alternating laminate structure.

In addition, from a photograph taken of the observation surface, a structure form in the alternating laminate structure was specified. These measurement results are shown in Table 8.

As to the processing time until the tool life was reached in Cutting Test 1 (wear resistance test), evaluations were made with grade "A" for 40 minutes or more, with grade "B" for 30 minutes or more and less than 40 minutes, and with grade "C" for less than 30 minutes. In addition, as to the number of shocks until the tool life was reached in Cutting Test 2 (fracture resistance test), evaluations were made with grade "A" for 3000 or more, with grade "B" for 2000 or more and less than 3000, and with grade "C" for less than 2000. In the evaluations, "A" means best, "B" means second best, "C" means worst, and the larger numbers of "A"s and "B"s mean more excellent cutting performance. The obtained evaluation results are shown in Table 9.

TABLE 9

| | Cutting test 1 (Wear resistance) | | Cutting test 2 (Fracture resistance) Tool life | |
|---|---|---|---|---|
| | Tool life (minutes) | Evaluation | (number of shocks) | Evaluation |
| Invention sample 21 | 49 | A | 3000 | A |
| Invention sample 22 | 41 | A | 3500 | A |
| Invention sample 23 | 43 | A | 3000 | A |
| Invention sample 24 | 37 | B | 3200 | A |
| Invention sample 25 | 36 | B | 3700 | A |

According to the results shown in Table 9, in each of Cutting Test 1 (wear resistance test) and Cutting Test 2 (fracture resistance test), each of the invention samples was evaluated with "B" or more. Therefore, it was found that the tool life of invention samples were extended by improving the wear resistance and the fracture resistance even when the invention sample had the upper layer and/or the lower layer.

INDUSTRIAL APPLICABILITY

Since the coated cutting tool of the invention is excellent in the wear resistance and the fracture resistance, the tool life can be extended as compared with that in the related art. Therefore, the coated cutting tool has high industrial applicability in this respect.

REFERENCE SIGNS LIST

1: Substrate, 2: Second layer, 3: First layer, 4: Lower layer, 5: Upper layer, 6: Alternating laminate structure, 7: Coating layer, 8: Coated cutting tool, 9: Rake face, 10: a

TABLE 8

| | Coating layer | | | |
|---|---|---|---|---|
| | Atomic ratio of Ti element to total ratio of all metal elements | Alternating laminate structure | | |
| | | Average grain size (μm) | Structure form | Aspect ratio |
| Invention sample 21 | 0.78 | 0.5 | Columnar crystal | 2.0 |
| Invention sample 22 | 0.72 | 0.3 | Columnar crystal | 1.8 |
| Invention sample 23 | 0.81 | 0.6 | Columnar crystal | 1.4 |
| Invention sample 24 | 0.74 | 0.2 | Columnar crystal | 2.1 |
| Invention sample 25 | 0.72 | 0.2 | Columnar crystal | 2.1 |

By using the obtained sample, Cutting Tests 1 and 2 which were the same as performed in Example 1 were performed, and evaluations were made.

crystal grain among the crystal grains used to measure the average grain size, 20: a part of straight line used to measure the average grain size, 30: a maximum distance in the perpendicular direction from the straight line 20 in the crystal grain 10 toward the surface side, 40: a maximum distance in the perpendicular direction from the straight line 20 in the crystal grain 10 toward the substrate side, 50: a length of a long axis, 60: Substrate

What is claimed is:

1. A coated cutting tool comprising a substrate and a coating layer formed on a surface of the substrate, wherein
the coating layer comprises an alternating laminate structure in which two or more first layers and two or more second layers are alternately laminated,
the first layer is a compound layer containing a composition represented by a following formula (1):

$$Ti(C_a N_{1-a}) \quad (1)$$

[where a represents an atomic ratio of a C element to a total ratio of the C element and an N element and satisfies 0.1≤a≤0.4],
the second layer is a compound layer containing a composition represented by a following formula (2):

$$(Ti_x Al_{1-x})(C_y N_{1-y}) \quad (2)$$

[where x represents an atomic ratio of a Ti element to a total ratio of the Ti element and an Al element and satisfies 0.4<x<0.8, and y represents an atomic ratio of a C element to a total ratio of the C element and an N element and satisfies 0.1≤y≤0.4],
an average thickness per layer of each of the first layers and the second layers in the alternating laminate structure is 3 nm or more and 300 nm or less,
an average thickness of the alternating laminate structure is 1.0 µm or more and 8.0 µm or less, and
an average grain size of crystal grains in the alternating laminate structure is 0.1 µm or more and 1.0 µm or less.

2. The coated cutting tool according to claim 1, wherein an atomic ratio of the Ti element to a total ratio of all metal elements in the coating layer is 0.7 or more and 0.9 or less.

3. The coated cutting tool according to claim 1, wherein a structure form in the alternating laminate structure is a columnar crystal.

4. The coated cutting tool according to claim 1, wherein
the coating layer comprises a lower layer between the substrate and the alternating laminate structure,
the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and
an average thickness of the lower layer is 0.2 µm or more and 3.0 µm or less.

5. The coated cutting tool according to claim 1, wherein
the coating layer comprises an upper layer on the surface opposite to the substrate in the alternating laminate structure,
the upper layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and
an average thickness of the upper layer is 0.2 µm or more and 3.0 µm or less.

6. The coated cutting tool according to claim 1, wherein an average thickness of the entire coating layer is 1.0 µm or more and 10.0 µm or less.

7. The coated cutting tool according to claim 2, wherein the average grain size of crystal grains in the alternating laminate structure is 0.2 µm or more and 0.9 µm or less.

8. The coated cutting tool according to claim 2, wherein a structure form in the alternating laminate structure is a columnar crystal.

9. The coated cutting tool according to claim 4 wherein a structure form in the alternating laminate structure is a columnar crystal.

10. The coated cutting tool according to claim 7, wherein a structure form in the alternating laminate structure is a columnar crystal.

11. The coated cutting tool according to claim 2, wherein
the coating layer comprises a lower layer between the substrate and the alternating laminate structure,
the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and
an average thickness of the lower layer is 0.2 µm or more and 3.0 µm or less.

12. The coated cutting tool according to claim 5, wherein
the coating layer comprises a lower layer between the substrate and the alternating laminate structure,
the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and
an average thickness of the lower layer is 0.2 µm or more and 3.0 µm or less.

13. The coated cutting tool according to claim 3, wherein
the coating layer comprises a lower layer between the substrate and the alternating laminate structure,
the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and
an average thickness of the lower layer is 0.2 µm or more and 3.0 µm or less.

14. The coated cutting tool according to claim 7, wherein
the coating layer comprises a lower layer between the substrate and the alternating laminate structure,
the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the lower layer is 0.2 μm or more and 3.0 μm or less.

15. The coated cutting tool according to claim 8, wherein the coating layer comprises a lower layer between the substrate and the alternating laminate structure, the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the lower layer is 0.2 μm or more and 3.0 μm or less.

16. The coated cutting tool according to claim 9, wherein the coating layer comprises a lower layer between the substrate and the alternating laminate structure, the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the lower layer is 0.2 μm or more and 3.0 μm or less.

17. The coated cutting tool according to claim 10, wherein the coating layer comprises a lower layer between the substrate and the alternating laminate structure, the lower layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the lower layer is 0.2 μm or more and 3.0 μm or less.

18. The coated cutting tool according to claim 2, wherein the coating layer comprises an upper layer on the surface opposite to the substrate in the alternating laminate structure, the upper layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the upper layer is 0.2 μm or more and 3.0 μm or less.

19. The coated cutting tool according to claim 11, wherein the coating layer comprises an upper layer on the surface opposite to the substrate in the alternating laminate structure, the upper layer is a single layer or a laminated layer containing a compound containing an element of at least one kind selected from the group consisting of Ti, Zr, Hf, V, Nb, Ta, Cr, Mo, W, Al, Si, and Y and an element of at least one kind selected from the group consisting of C, N, O, and B (however, the compound having the composition represented by the formula (1) and the compound having the composition represented by the formula (2) are excluded), and an average thickness of the upper layer is 0.2 μm or more and 3.0 μm or less.

* * * * *